(12) United States Patent
Hara

(10) Patent No.: US 10,803,936 B2
(45) Date of Patent: Oct. 13, 2020

(54) SEMICONDUCTOR MEMORY DEVICE

(71) Applicant: TOSHIBA MEMORY CORPORATION, Tokyo (JP)

(72) Inventor: Hiroyuki Hara, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,872

(22) Filed: Aug. 30, 2019

(65) Prior Publication Data

US 2020/0286555 A1 Sep. 10, 2020

(30) Foreign Application Priority Data

Mar. 7, 2019 (JP) .................................. 2019-041749

(51) Int. Cl.
| G11C 13/00 | (2006.01) |
| H01L 23/528 | (2006.01) |
| H01L 45/00 | (2006.01) |
| H01L 27/24 | (2006.01) |

(52) U.S. Cl.
CPC ...... *G11C 13/0026* (2013.01); *G11C 13/0028* (2013.01); *H01L 23/528* (2013.01); *H01L 27/2463* (2013.01); *H01L 45/1233* (2013.01)

(58) Field of Classification Search
CPC .................................... G11C 5/06; G11C 8/12
USPC .............................................. 365/63, 230.03
See application file for complete search history.

(56) References Cited

U.S. PATENT DOCUMENTS

| 5,999,528 | A * | 12/1999 | Chow | ................ | H04Q 11/0478 370/365 |
| 6,594,284 | B1 * | 7/2003 | Page | ........................ | G01V 1/22 370/503 |
| 6,690,848 | B2 * | 2/2004 | Graves | ..................... | H04J 14/02 385/16 |
| 6,882,800 | B1 * | 4/2005 | Graves | ................ | H04J 14/0209 398/46 |
| 6,914,809 | B2 * | 7/2005 | Hilton | ..................... | G11C 11/16 365/158 |
| 6,999,677 | B2 * | 2/2006 | Graves | ................ | H04J 14/0293 385/16 |
| 7,099,231 | B2 * | 8/2006 | Au | ........................... | G11C 7/08 365/189.02 |

(Continued)

FOREIGN PATENT DOCUMENTS

JP 2017055082 A 3/2017

*Primary Examiner* — Michael T Tran
(74) *Attorney, Agent, or Firm* — Kim & Stewart LLP

(57) ABSTRACT

A semiconductor memory device includes first wirings above a substrate and extending in a first direction, second wirings above the first wirings and extending in a second direction crossing the first direction, third wirings above the second wirings and extending in the first direction, memory cells between the first and second wirings and between the second and third wirings, a first multiplexer that extends in the second direction, is connected to the first wirings, and is provided in a first region which overlaps with the first, second, and third wirings in a third direction that crosses the first and second directions, and a second multiplexer that extends in the first direction, is connected to the second wirings, and is provided in a second region which overlaps with the first, second, and third wirings in the third direction.

14 Claims, 7 Drawing Sheets

(56) References Cited

U.S. PATENT DOCUMENTS

| | | | | |
|---|---|---|---|---|
| 7,154,887 B2* | 12/2006 | Wu | H04L 49/1515 | 370/388 |
| 7,324,541 B2* | 1/2008 | Muthukrishnan | H04L 49/254 | 370/429 |
| 7,606,059 B2* | 10/2009 | Toda | G11C 13/0011 | 365/148 |
| 7,633,789 B2* | 12/2009 | Norman | G11C 5/02 | 365/148 |
| 7,986,567 B2* | 7/2011 | Norman | G11C 5/02 | 365/189.05 |
| 8,413,013 B2* | 4/2013 | Toda | G06F 11/1048 | 714/763 |
| 8,471,362 B2* | 6/2013 | Lee | G11C 5/025 | 257/532 |
| 9,148,370 B2* | 9/2015 | Beshai | H04L 45/44 | |
| 9,177,619 B2* | 11/2015 | Kajigaya | G11C 7/065 | |
| 9,236,097 B2* | 1/2016 | Sugamoto | G11C 7/08 | |
| 9,589,604 B1* | 3/2017 | Fritsch | G11C 29/026 | |
| 10,128,971 B2* | 11/2018 | Boduch | H04J 14/0204 | |
| 10,176,868 B2* | 1/2019 | Kitagawa | G11C 13/0069 | |
| 10,546,641 B1* | 1/2020 | Vahidimowlavi | G11C 8/14 | |
| 10,586,589 B2* | 3/2020 | Pickering | G11C 7/12 | |
| 10,650,791 B2* | 5/2020 | Kempf | G06F 1/163 | |
| 2003/0179644 A1* | 9/2003 | Anvar | G11C 29/808 | 365/233.1 |
| 2006/0291266 A1* | 12/2006 | Zhang | G11C 16/0491 | 365/100 |
| 2011/0122687 A1* | 5/2011 | Kwon | G11C 11/4091 | 365/185.02 |
| 2011/0199840 A1* | 8/2011 | Kajigaya | G11C 11/4096 | 365/189.15 |
| 2011/0309475 A1* | 12/2011 | Lee | G11C 5/025 | 257/532 |
| 2013/0215698 A1* | 8/2013 | Nagata | G11C 11/4091 | 365/203 |
| 2015/0063039 A1* | 3/2015 | Chen | G11C 29/808 | 365/189.02 |
| 2015/0243356 A1* | 8/2015 | Conte | G11C 8/04 | 365/163 |
| 2015/0262626 A1* | 9/2015 | Hatsuda | G11C 11/1653 | 365/72 |
| 2015/0277770 A1* | 10/2015 | Tsai | G11C 5/025 | 711/104 |
| 2016/0078919 A1* | 3/2016 | Han | G11C 5/02 | 365/207 |
| 2016/0276023 A1* | 9/2016 | Chen | G11C 11/1675 | |
| 2017/0076802 A1* | 3/2017 | Mokhlesi | G11C 16/10 | |
| 2017/0077100 A1 | 3/2017 | Takahashi | | |
| 2017/0084328 A1* | 3/2017 | Hsu | G11C 16/3459 | |
| 2017/0177526 A1* | 6/2017 | Wu | G11C 7/1048 | |
| 2017/0206949 A1* | 7/2017 | Pickering | G11C 7/12 | |

* cited by examiner

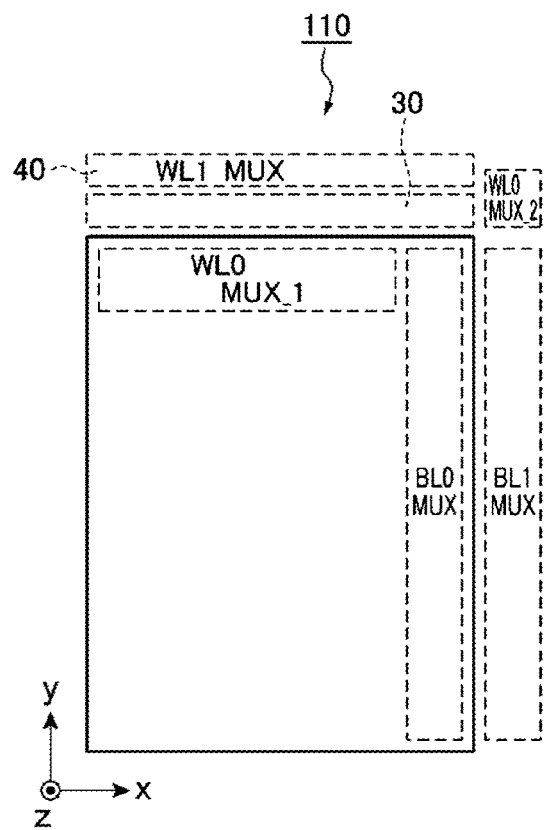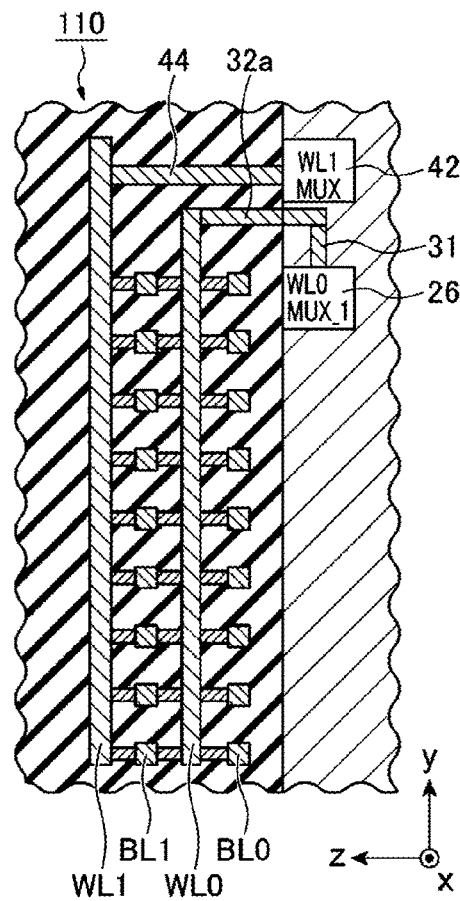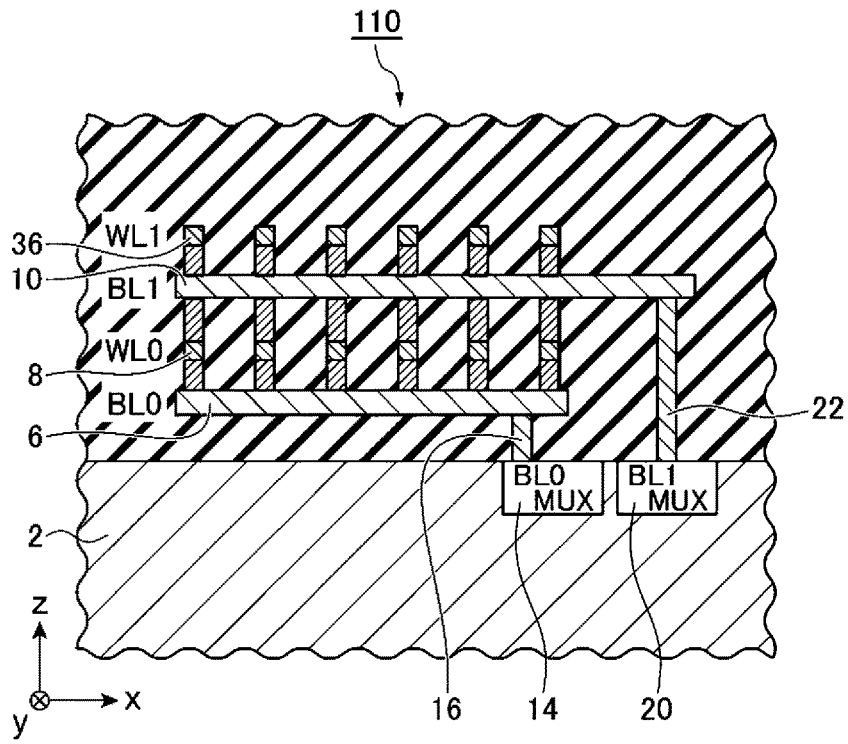

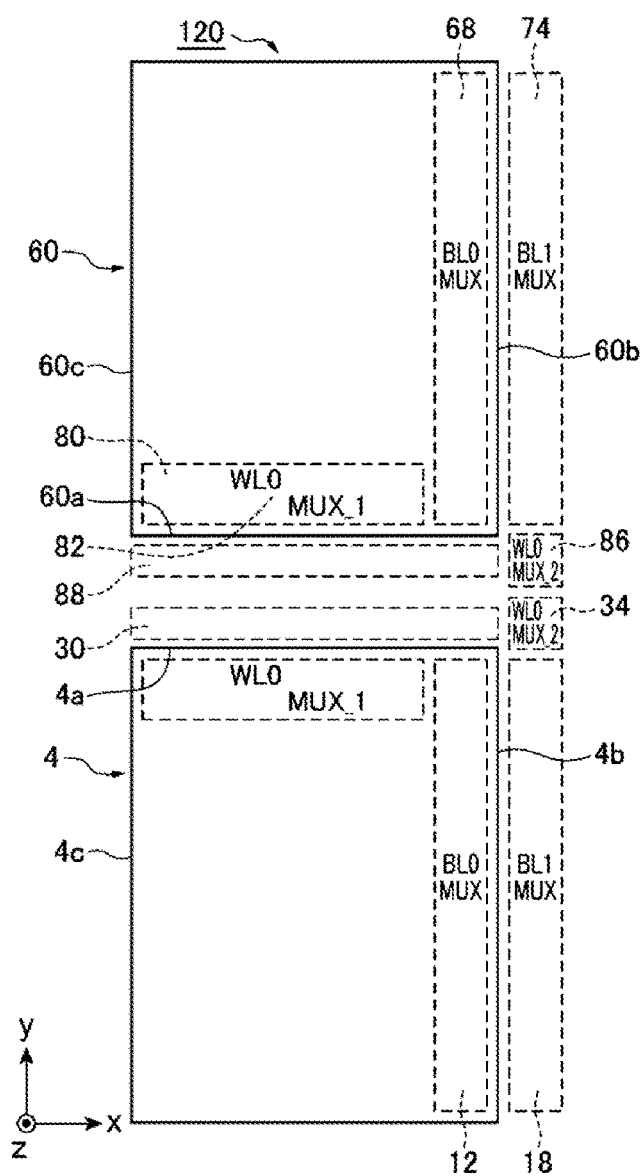
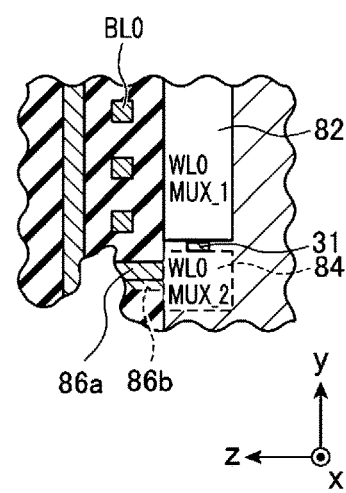
FIG. 6A
FIG. 6C
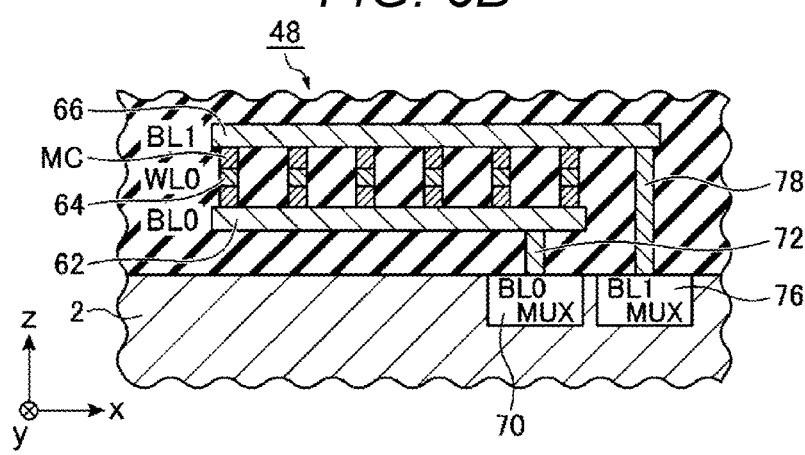
FIG. 6B

US 10,803,936 B2

SEMICONDUCTOR MEMORY DEVICE

CROSS-REFERENCE TO RELATED APPLICATION(S)

This application is based upon and claims the benefit of priority from Japanese Patent Application No. 2019-041749, filed Mar. 7, 2019, the entire contents of which are incorporated herein by reference.

FIELD

Embodiments described herein relate generally to a semiconductor memory device.

BACKGROUND

A cross-point type memory device using a variable resistance element as a memory cell array is attracting attention because the device is capable of easily implementing a large-capacity memory device as compared to other devices of the related art.

In the cross-point type memory device, a large number of wirings called bit lines and word lines are cross-arranged (e.g., arranged orthogonal to each other), and a memory cell is formed between the bit line and the word line. Writing of one memory cell is performed by applying a voltage or a current to the bit line and the word line connected to the memory cell.

DESCRIPTION OF THE DRAWINGS

FIGS. 5A to 5C are schematic views of a semiconductor memory device of a second embodiment.

FIGS. 6A to 6C are schematic views of a semiconductor memory device of a third embodiment.

DETAILED DESCRIPTION

Figure 1:
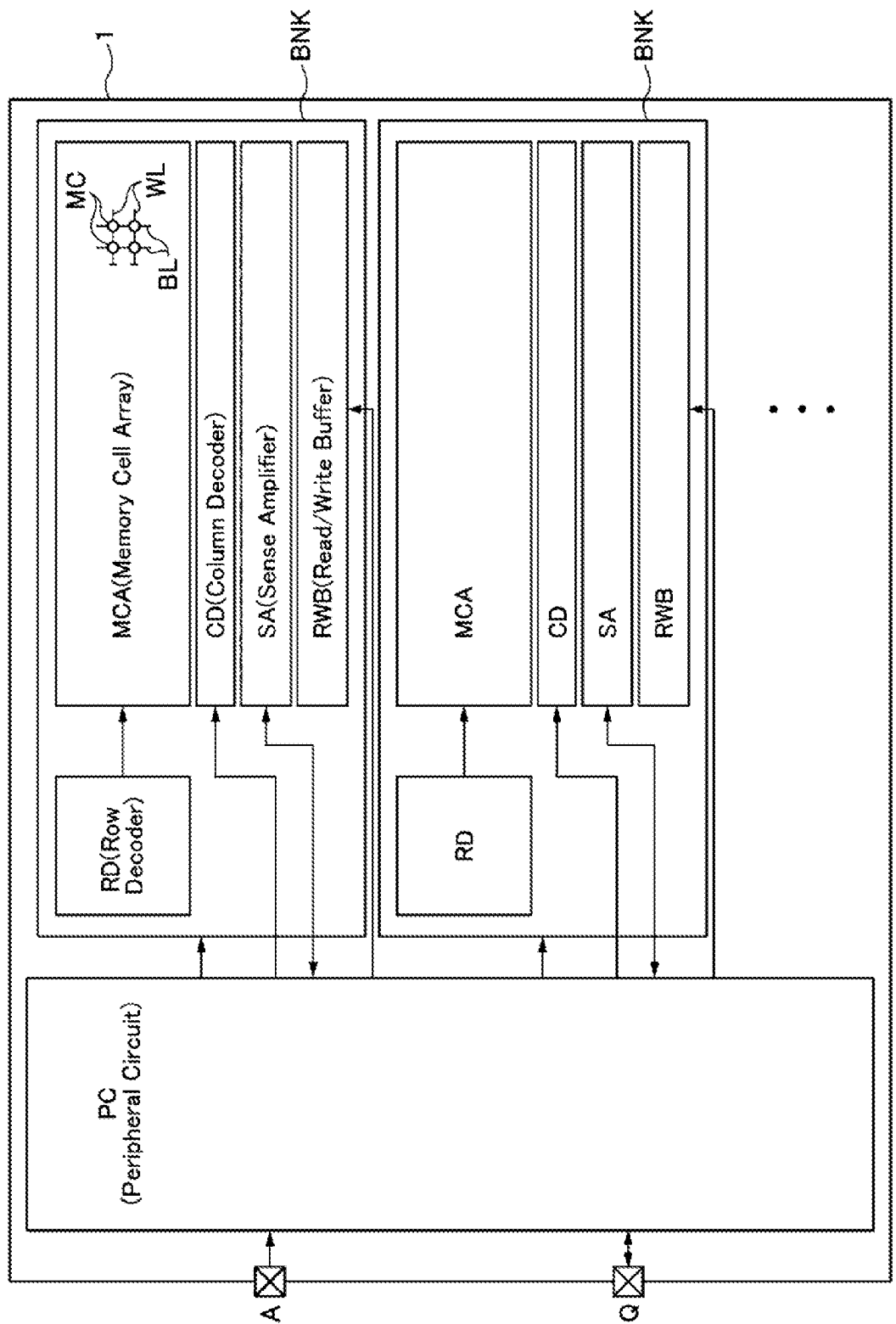
FIG. 1 is a block diagram illustrating a configuration of a memory system of a first embodiment.

Embodiments provide a semiconductor memory device that may achieve size reduction.

In general, according to one embodiment, the semiconductor memory device includes a substrate, a plurality of first wirings above the substrate in a first plane parallel to a substrate surface, each extending in a first direction, a plurality of second wirings above the plurality of first wirings in a second plane parallel to the substrate surface, each extending in a second direction crossing the first direction, a plurality of third wirings above the plurality of second wirings in a third plane parallel to the substrate surface, each extending in the first direction, a plurality of memory cells provided between the plurality of first wirings and the plurality of second wirings and between the plurality of second wirings and the plurality of third wirings, respectively, a first multiplexer that extends in the second direction and is provided in a first region which overlaps with the plurality of first, second, and third wirings in a third direction that crosses the first and second directions, a plurality of first connection wirings, each extending in the third direction to connect the first multiplexer to one of the plurality of first wirings, a second multiplexer that extends in the second direction and is provided in a second region which is adjacent to the first region in the first direction, and does not overlap with any of the plurality of first and second wirings in the third direction, a plurality of second connection wirings, each extending in the third direction to connect the second multiplexer to one of the plurality of third wirings, a third multiplexer that extends in the first direction and is provided in a third region which overlaps with the plurality of first, second, and third wirings in the third direction, and a plurality of third connection wirings, each extending in the third direction to connect the third multiplexer to one of the plurality of second wirings.

Hereinafter, embodiments will be described with reference to the drawings. In the drawings, the same or similar portions will be denoted by the same or similar reference numerals.

In the present specification, in order to indicate a positional relationship of components or the like, the upward direction of a drawing is described as "upper," and the downward direction of the drawing is described as "lower." In the present specification, the concept of "upper" and "lower" does not necessarily indicate a relationship with respect to a direction of gravity.

First Embodiment

FIG. 1 is a block diagram illustrating a configuration of a memory system 1 of the first embodiment.

The semiconductor memory device of the first embodiment is, for example, a volatile memory such as a dynamic random access memory (DRAM), or a non-volatile memory such as a NAND-type electrically erasable and programmable read-only-memory (EEPROM), a resistive RAM (ReRAM), or a magnetoresistive RAM (MRAM).

The memory system 1 illustrated in FIG. 1 includes a memory cell array MCA, a column decoder CD, a row decoder RD, a sense amplifier SA, a read write buffer RWB, and a peripheral circuit PC.

The memory cell array MCA includes a plurality of memory cells MC two-dimensionally arranged in, for example, a matrix form. The memory cell MC is, for example, a resistance-change type memory such as a ReRAM. The memory cell MC is disposed, for example, at a location where a bit line BL crosses over or under a word line WL. That is, the memory cell array MCA is a so-called cross-point type memory cell array. When viewed from the upper side or the lateral side of the semiconductor substrate, the bit line BL is substantially orthogonal to the word line WL. A plurality of bit lines BL is connected to one ends of the memory cells MC, respectively, in the memory cell array MCA. A plurality of word lines WL is connected to gate terminals of the memory cells MC, respectively, in the memory cell array MCA. The memory cell array MCA is divided into a plurality of banks BNK in one chip. In one example, the sense amplifier SA, a data latch DL, and an address latch AL are separately provided for each bank BNK.

The sense amplifier SA is connected to the memory cell MC via, for example, the bit line BL, and applies a write voltage or a read voltage to the memory cell MC via the bit line BL. The sense amplifier SA writes data into the memory cell MC by applying a write voltage to the memory cell MC, or reads data from the memory cell MC by applying a read voltage to the memory cell MC.

The read write buffer RWB temporarily stores data or an address detected by the sense amplifier SA, for each page, or temporarily stores data or an address to be written into the memory cell array MCA, for each page.

The row decoder RD and the column decoder CD access the memory cell array MCA on the basis of a bank address or a page address to apply a write voltage or a read voltage to the word line WL or the bit line BL. The row decoder RD applies a write voltage or a read voltage to a selected word line among the plurality of word lines WL. The column decoder CD connects a selected bit line that is selected among the plurality of bit lines BL, to the sense amplifier SA. The sense amplifier SA applies a write voltage or a read voltage to the selected bit line. Accordingly, the memory system 1 may write data into a desired memory cell MC in the memory cell MC, or read data from a desired memory cell MC.

Figure 2:
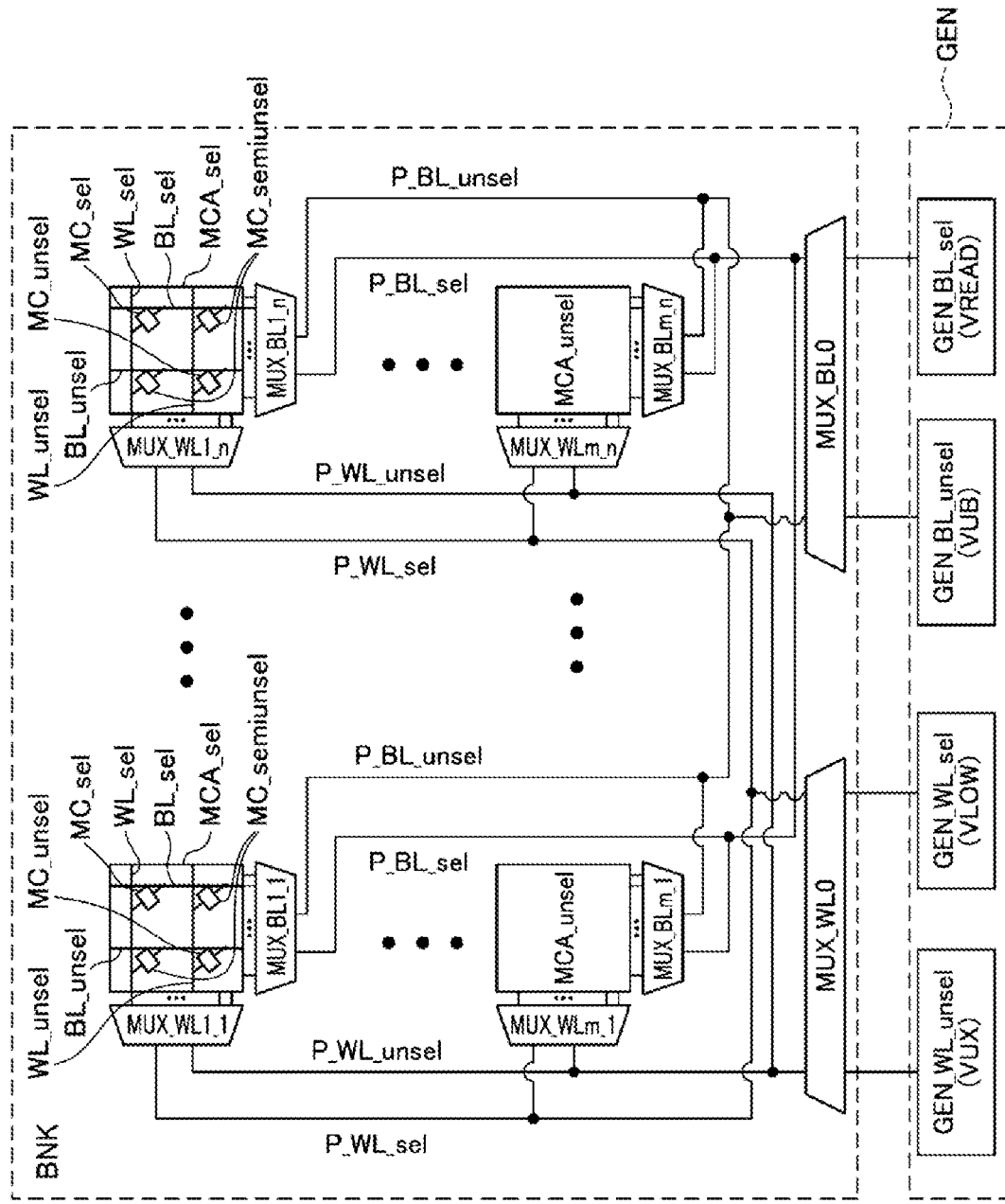
FIG. 2 is a block diagram illustrating an example of a detailed configuration of a bank, a column decoder, and a row decoder in the first embodiment.

The peripheral circuit PC includes, for example, a voltage generation circuit, a read write engine, an address controller, a command controller, an input/output circuit and the like (not illustrated). The voltage generation circuit GEN generates a voltage of the word line WL or a voltage of the bit line BL, which is required for a data read operation and a data write operation. FIG. 2 illustrates a more detailed configuration of the voltage generation circuit GEN. The read write engine controls the column decoder CD and the row decoder RD to write data into a desired memory cell MC in the bank BNK, or reads data from a desired memory cell MC in the bank BNK, according to a command and an address. The read write engine transmits the read data to a DQ buffer of the input/output circuit. The address controller receives a row address, a column address and the like, and decodes these addresses. The command controller receives commands indicating various operations such as a data read operation and a data write operation, and transmits these commands to the read write engine. The input/output circuit IO acquires a command and an address from a terminal CA, transmits the command to the command controller, and transmits the address to the address controller. The command may be a write command that instructs a write operation or a read command that instructs a read operation. The address may be a bank address indicating any bank BNK of the memory cell array MCA, or an address indicating a page or a memory cell MC as a read or write target in the bank BNK. The input/output circuit acquires write data from a DQ terminal, and transmits the write data to the read write buffer RWB. In addition, the input/output circuit receives read data stored in the data latch DL, and outputs the read data through the DQ terminal.

A memory controller (not illustrated) may be provided outside the memory system 1 to control all of a plurality of memory systems 1.

FIG. 2 is a block diagram illustrating an example of a more detailed configuration of the bank BNK, the column decoder CD, and the row decoder RD. The bank BNK includes the memory cell array MCA, and may include a plurality of memory cell arrays subdivided corresponding to bit line multiplexers MUX_BL1_1 to MUX_BLm_n, and word line multiplexers MUX_WL1_1 to MUX_WLm_n. Hereinafter, the subdivided memory cell arrays will be referred to as MCA.

The memory system 1 includes the memory cell arrays MCA, bit line multiplexers MUX_BL1_1 to MUX_BLm_n, and bit line multiplexer MUX_BL0 as the column decoders CD, word line multiplexers MUX_WL1_1 to MUX_WLm_n, and word line multiplexer MUX_WL0 as the row decoders RD, bit line paths P_BL_sel and P_BL_unsel, word line paths P_WL_sel and P_WL_unsel, a selected BL voltage generation circuit GEN_BL_sel, an unselected BL voltage generation circuit GEN_BL_unsel, a selected WL voltage generation circuit GEN_WL_sel, and an unselected WL voltage generation circuit GEN_WL_unsel.

The multiplexer is configured using a switching element such as a metal oxide semiconductor field effect transistor (MOSFET).

The column decoders CD as first decoders include the bit line multiplexers MUX_BL1_1 to MUX_BLm_n, and bit line multiplexer MUX_BL0. The bit line multiplexers MUX_BL1_1 to MUX_BLm_n are provided corresponding to the memory cell arrays MCA, respectively, and are connected to the plurality of bit lines BL of the memory cell arrays MCA, respectively. Each of m and n is an integer of 1 or more. Each of the bit line multiplexers MUX_BL1_1 to MUX_BLm_n connects one selected bit line BL_sel selected from the bit lines BL of the corresponding memory cell array MCA, to a selected bit line path P_BL_sel, and applies a selected bit line voltage VREAD. Each of the bit line multiplexers MUX_BL1_1 to MUX_BLm_n connects an unselected bit line BL_unsel other than the selected bit line BL_sel to an unselected bit line path P_BL_unsel, and applies an unselected bit line voltage VUB. Otherwise, each of the bit line multiplexers MUX_BL1_1 to MUX_BLm_n places the unselected bit line BL_unsel in a floating state, and does not apply a voltage.

The bit line multiplexer MUX_BL0 is connected between the selected BL voltage generation circuit GEN_BL_sel and a plurality of bit line paths, and between the unselected BL voltage generation circuit GEN_BL_unsel and the plurality of bit line paths. The bit line multiplexer MUX_BL0 connects one bit line path selected among the plurality of bit line paths, as the selected bit line path P_BL_sel, to the selected BL voltage generation circuit GEN_BL_sel. Also, the bit line multiplexer MUX_BL0 connects the unselected bit line path as P_BL_unsel, among the plurality of bit line paths, to the unselected BL voltage generation circuit GEN_BL_unsel.

The bit line paths P_BL_sel and P_BL_unsel are wiring paths which are connected between the bit line multiplexers MUX_BL1_1 to MUX_BLm_n and the bit line multiplexer MUX_BL0. For example, 32 or 64 bit line paths are provided. As described above, the bit line multiplexer MUX_BL0 selects one among the plurality of bit line paths, and connects the selected bit line path P_BL_sel to the selected BL voltage generation circuit GEN_BL_sel. The selected bit line path P_BL_sel transfers the selected bit line voltage VREAD. Also, the bit line multiplexer MUX_BL0 connects the unselected bit line path P_BL_unsel among the plurality of bit line paths to the unselected BL voltage generation circuit GEN_BL_unsel. The bit line path P_BL_unsel transfers the unselected bit line voltage VUB. The selected BL voltage generation circuit GEN_BL_sel as a first power supply circuit generates the selected bit line voltage VREAD to be applied to the selected bit line BL_sel, from an external power supply. The selected bit line voltage VREAD is a high level voltage, and is, for example, several volts in magnitude, such as 2 to 3 volt. The selected bit line path P_BL_sel transfers the selected bit line voltage VREAD to the bit line multiplexers MUX_BL1_1 to MUX_BLm_n from the bit line multiplexer MUX_BL0. Each of the bit line multiplexers MUX_BL1_1 to MUX_BLm_n, and bit line multiplexer MUX_BL0 as the first decoders electrically connect the selected bit line BL_sel among the plurality of bit lines BL to the selected BL voltage generation circuit GEN_BL_sel through the selected bit line path P_BL_sel, and selectively apply the selected bit line voltage VREAD to the selected bit line BL_sel.

The unselected BL voltage generation circuit GEN_BL_unsel as a second power supply circuit generates the unselected bit line voltage VUB to be applied to the unselected bit line BL_unsel, from the external power supply. The unselected bit line voltage VUB is a voltage between the selected bit line voltage VREAD and a selected word line voltage VLOW, and is, for example, VREAD/2. The unselected bit line path P_BL_unsel transfers the unselected bit line voltage VUB to the bit line multiplexers MUX_BL1_1 to MUX_BLm_n from the bit line multiplexer MUX_BL0. The bit line multiplexers MUX_BL0 and each of bit line multiplexers MUX_BL1_1 to MUX_BLm_n as the first decoders electrically connect the unselected bit line BL_unsel to the unselected BL voltage generation circuit GEN_BL_unsel through the unselected bit line path P_BL_unsel, and selectively apply the unselected bit line voltage VUB to the unselected bit line BL_unsel. Otherwise, the bit line multiplexers MUX_BL0 and each of bit line multiplexers MUX_BL1_1 to MUX_BLm_n do not apply a voltage to the unselected bit line BL_unsel.

The row decoders RD as second decoders include the word line multiplexers MUX_WL1_1 to MUX_WLm_n, and word line multiplexer MUX_WL0. The word line multiplexers MUX_WL1_1 to MUX_WLm_n are provided corresponding to the memory cell arrays MCA, respectively, and are connected to the plurality of word lines WL of the memory cell arrays MCA, respectively. Each of the word line multiplexers MUX_WL1_1 to MUX_WLm_n connects one selected word line WL_sel selected from the word lines WL of the corresponding memory cell array MCA, to a word line path P_WL_sel, and applies the selected word line voltage VLOW. Each of the word line multiplexers MUX_WL1_1 to MUX_WLm_n connects an unselected line WL_unsel other than the selected word line WL_sel to a word line path P_WL_unsel, and applies an unselected word line voltage VUX. The word line multiplexer MUX_WL0 is connected between the selected WL voltage generation circuit GEN_WL_sel and a plurality of word line paths, and between the unselected WL voltage generation circuit GEN_WL_unsel and the plurality of word line paths. The word line multiplexer MUX_WL0 connects one word line path selected among the plurality of word line paths, as P_WL_sel, to the selected WL voltage generation circuit GEN_WL_sel. Also, the word line multiplexer MUX_WL0 connects the unselected word line path as P_WL_unsel, among the plurality of word line paths, to the unselected WL voltage generation circuit GEN_WL_unsel.

The word line paths P_WL_sel and P_WL_unsel are wiring paths which are connected between the word line multiplexers MUX_WL1_1 to MUX_WLm_n and the word line multiplexer MUX_WL0. For example, 32 or 64 word line paths are provided. As described above, the word line multiplexer MUX_WL0 selects one among the plurality of word line paths, and connects the selected word line path P_WL_sel to the selected WL voltage generation circuit GEN_WL_sel. The word line path P_WL_sel transfers the selected word line voltage VLOW. Also, the word line multiplexer MUX_WL0 connects the unselected word line path P_WL_unsel among the plurality of word line paths to the unselected WL voltage generation circuit GEN_WL_unsel. The word line path P_WL_unsel transfers the unselected word line voltage VUX. The selected WL voltage generation circuit GEN_WL_sel as a third power supply circuit generates the selected word line voltage VLOW to be applied to the selected word line WL_sel, from the external power supply. The selected word line voltage VLOW is a low level voltage, and is, for example, a ground voltage (0V). The word line path P_WL_sel transfers the selected word line voltage VLOW to the word line multiplexers MUX_WL1_1 to MUX_WLm_n from the word line multiplexer MUX_WL0. Each of the word line multiplexers MUX_WL1_1 to MUX_WLm_n, and word line multiplexer MUX_WL0 as the second decoders electrically connect the selected word line WL_sel among the plurality of word lines WL to the selected WL voltage generation circuit GEN_WL_sel through the selected word line path P_WL_sel, and selectively apply the selected word line voltage VLOW to the selected word line WL_sel.

The unselected WL voltage generation circuit GEN_WL_unsel as a fourth power supply circuit generates the unselected word line voltage VUX to be applied to the unselected word line WL_unsel, from the external power supply. The unselected word line voltage VUX is a voltage between the selected bit line voltage VREAD and the selected word line voltage VLOW, and is, for example, VREAD/2. It is desirable that the unselected word line voltage VUX is substantially the same as the unselected bit line voltage VUB. However, the unselected word line voltage VUX may be different from the unselected bit line voltage VUB. The unselected word line path P_WL_unsel transfers the unselected word line voltage VUX to the word line multiplexers MUX_WL1_1 to MUX_WLm_n from the word line multiplexer MUX_WL0. Each of the word line multiplexers MUX_WL1_1 to MUX_WLm_n as the second decoders electrically connects the unselected word line WL_unsel to the unselected WL voltage generation circuit GEN_WL_unsel through the unselected word line path P_WL_unsel, and selectively applies the unselected word line voltage VUX to the unselected word line WL_unsel.

In this manner, a voltage difference between the selected bit line voltage VREAD and the selected word line voltage VLOW is applied to a selected memory cell MC_sel connected to the selected bit line BL_sel and the selected word line WL_sel. Accordingly, data is read from the selected memory cell MC_sel or data is written into the selected memory cell MC_sel.

Figure 3A:
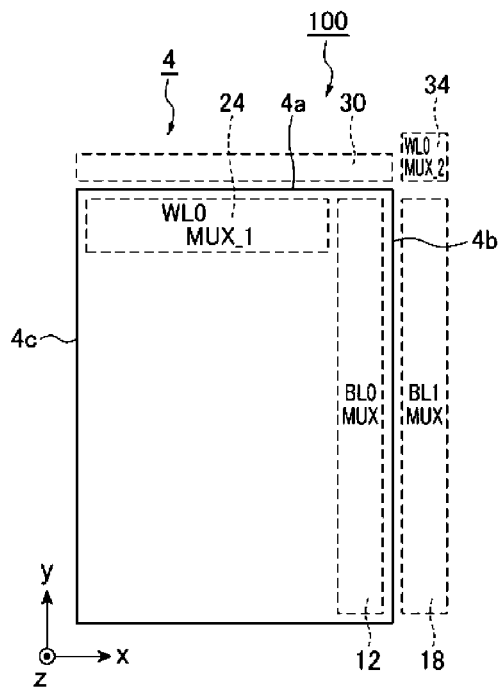
FIGS. 3A to 3C are schematic views of a semiconductor memory device of the first embodiment.
Figure 3C:
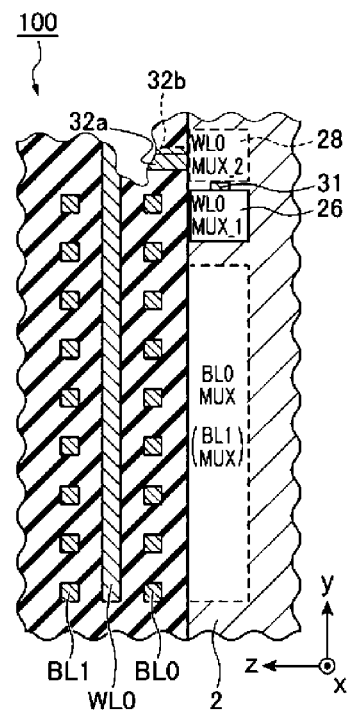
Figure 3B:
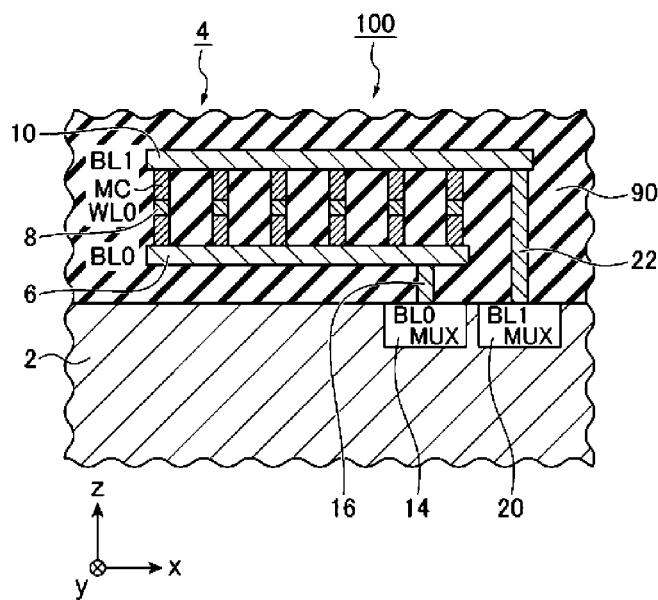

FIGS. 3A to 3c are schematic views of a semiconductor memory device 100 of the embodiment.

Here, an x axis, a y axis perpendicular to the x axis, and a z axis perpendicular to the x axis and the y axis are defined. It is assumed that the surface of a substrate 2 is disposed in parallel to an xy plane.

FIG. 3A is a block diagram of the semiconductor memory device 100 of the embodiment. FIG. 3B is an example of a schematic sectional view of the semiconductor memory device 100 of the embodiment, in a section parallel to an xz plane. FIG. 3C is an example of a schematic sectional view of the semiconductor memory device 100 of the embodiment, in a section parallel to a yz plane.

The semiconductor memory device 100 includes one memory cell array MCA illustrated in FIGS. 1 and 2, a multiplexer (e.g., MUX_BL1_1) as the column decoder CD provided for such a memory cell array MCA, and a multiplexer (e.g., MUX_WL1_1) as the row decoder RD provided for such a memory cell array MCA.

The memory system 1 or the semiconductor memory device 100 is provided on the substrate 2 such as a semiconductor substrate.

A first region 4 is a region in which, for example, one memory cell array MCA is provided. The first region 4 is provided on the substrate 2, for example. The first region 4 is a rectangular region that has a first side 4a, a second side 4b, and a third side 4c facing the second side 4b, in a plane parallel to the surface of the substrate 2. In FIGS. 3A to 3C, the first region 4 is illustrated as a rectangular region, but is not limited to the rectangular shape. Additionally, the first side 4a is provided in parallel to an x direction, and the second side 4b and the third side 4c are provided in parallel to a y direction.

A bit line wiring BL0 6 extends parallel to the first side 4a, in the first region 4 on the substrate 2. A word line wiring WL0 8 extends parallel to the second side 4b, in the first region 4 above the bit line wiring BL0. A bit line wiring BL1 10 extends parallel to the first side 4a, in the first region 4 on the word line wiring WL0 8. The memory cells MC are provided between the bit line wiring BL0 6 and the word line wiring WL0 8, and between the word line wiring WL0 8 and the bit line wiring BL1 10, respectively.

A bit line multiplexer BL0_MUX 14 is a part of the column decoders CD and is provided in a second region 12 along the second side 4b, in the first region 4 between the substrate 2 and the bit line wiring BL0. For example, the bit line multiplexer BL0_MUX 14 is formed on the surface of the substrate 2 by using a known semiconductor device forming process.

A first connection wiring 16 is provided between the bit line multiplexer BL0_MUX 14 and the bit line wiring BL0 to connect the bit line multiplexer BL0_MUX 14 to the bit line wiring BL0. The number of the first connection wirings 16 corresponds to the number of connections between the bit line multiplexer BL0_MUX 14 and the bit line wiring BL0, but the illustration thereof is omitted in FIG. 3B.

A bit line multiplexer BL1_MUX 20 is provided in a third region 18 adjacent to the second region 12 in the x direction, outside the first region 4. Specifically, for example, the bit line multiplexer BL1_MUX 20 is formed on the surface of the substrate 2 by using a known semiconductor device forming process. However, a place where the bit line multiplexer BL1_MUX 20 is provided is not limited thereto.

A second connection wiring 22 is provided between the bit line multiplexer BL1_MUX 20 and the bit line wiring BL1 to connect the bit line multiplexer BL1_MUX 20 to the bit line wiring BL1. The number of the second connection wirings 22 corresponds to the number of connections between the bit line multiplexer BL1_MUX 20 and the bit line multiplexer BL1 although that is not illustrated in FIG. 3B.

A word line multiplexer WL0_MUX_1 26 is provided in a fourth region 24 along the first side 4a between the third side 4c and the second region 12, in the first region 4 between the substrate 2 and the BL0. Specifically, for example, the word line multiplexer WL0_MUX_1 26 is formed on the surface of the substrate 2 by using a known semiconductor device forming process.

A word line multiplexer WL0_MUX_2 28 is provided outside the first region 4.

A third connection wiring 32 is provided in a fifth region 30 adjacent to the fourth region 24 in the y direction, outside the first region 4, to connect the word line multiplexer WL0_MUX_1 26 or the word line multiplexer WL0_MUX_2 28 to the WL0. That is, a multiplexer connected to the word line wiring WL0 includes the word line multiplexer WL0_MUX_1 26 provided in the fourth region 24 and the word line multiplexer WL0_MUX_2 28 provided outside the first region 4.

For example, the word line multiplexer WL0_MUX_2 28 is provided in a sixth region 34 that is adjacent to the third region 18 in the y direction and adjacent to the fifth region 30 in the x direction, outside the first region 4. Then, for example, the word line multiplexer WL0_MUX_1 26 is connected to a part of the WL0 by a third connection wiring 32a provided in the fifth region 30, and a wiring 31 provided in the substrate 2. The wiring 31 is connected to the third connection wiring 32a, for example, at the inner side of the paper of FIG. 3C, as compared to the word line multiplexer WL0_MUX_2 28. The mode of connection between a part of the WL0 and the word line multiplexer WL0_MUX_1 26 is not limited thereto. The word line multiplexer WL0_MUX_2 is connected to a third connection wiring 32b in the fifth region 30. In FIG. 3C, the third connection wiring 32a and the third connection wiring 32b do not overlap in the illustration in the x direction. However, in other embodiments, the third connection wiring 32a and the third connection wiring 32b may overlap with each other.

An insulator 90 is provided around the bit line wiring BL0, the word line wiring WL0, the bit line wiring BL1, the memory cell array MCA, the first connection wiring 16, the second connection wiring 22, the third connection wiring 32, the bit line multiplexer BL0_MUX 14, the bit line multiplexer BL1_MUX 20, the word line multiplexer WL0_MUX_1 26, and the word line multiplexer WL0_MUX_2 28, on the substrate 2. A barrier metal (not illustrated) is appropriately provided between the insulator 90 and each BL/WL or the like.

Hereinafter, the operation effect of the embodiment will be described.

Figure 4:
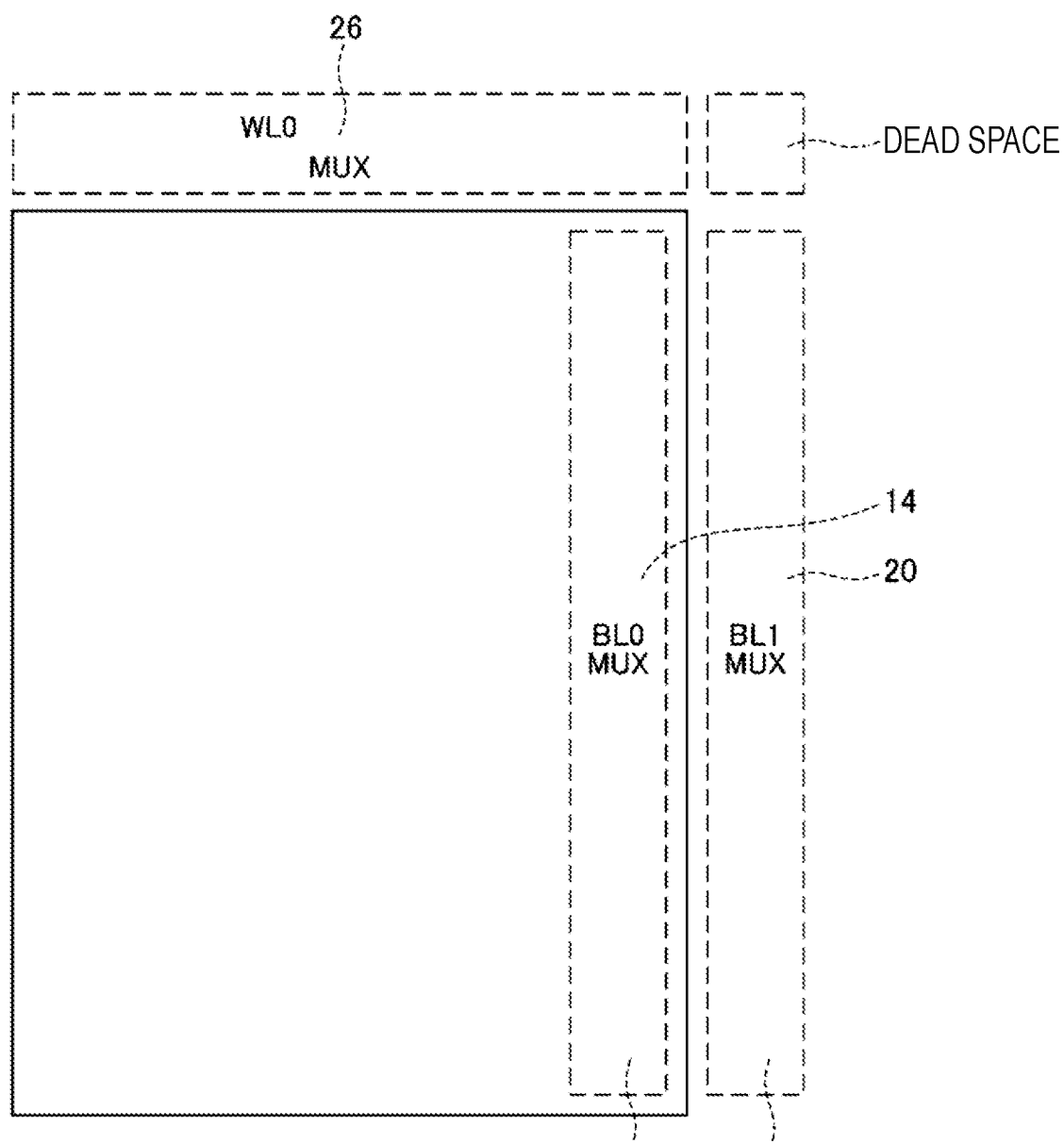
FIG. 4 is a schematic view of a semiconductor memory device according to a comparative example.

FIG. 4 is a schematic view of a semiconductor memory device 800, according to a comparative example.

In order to reduce the size of a semiconductor memory device, it is desirable that a multiplexer be disposed below the MCA. As for a multiplexer for a BL, it is desirable that the size (length) of a region where the multiplexer is disposed is the same as the length of a region where the BL is disposed. This is because when some of transistors in the multiplexer for the bit line BL are arranged at the same intervals as the bit lines BLs, the length of a wiring that connects the bit lines BL to the multiplexer for the bit lines BL should be shortened as much as possible so that a voltage loss caused by the length of the wiring can be reduced as much as possible. However, when the bit line multiplexer BL0_MUX 14 is disposed below the first region 4 as illustrated in FIG. 4, the word line multiplexer WL0_MUX 26 has no choice but to be disposed outside the first region 4, and this is not desirable from the viewpoint of size reduction.

Further, there is a problem in that a region illustrated in FIG. 4, which is adjacent to the third region 18 where the bit line multiplexer BL1_MUX 20 is disposed and to a region where the word line multiplexer WL0_MUX 26 is disposed, becomes a dead space. This is because it is difficult to provide a wiring or the like to the first region where the memory cell array MCA is disposed and to effectively utilize this region.

According to the semiconductor memory device 100 of the embodiment, the multiplexer connected to the word line wiring WL0 8 is made up of two word line multiplexers that are separately disposed, namely the word line multiplexer WL0_MUX_1 26 provided in the fourth region 24 along the first side 4a, between the third side 4c and the second region 12, and the word line multiplexer WL0_MUX_2 28 provided outside the first region 4. In the embodiment, the third connection wiring 32 is provided to connect the word line multiplexer WL0_MUX_1 26 or the word line multiplexer WL0_MUX_2 28 to the word line wiring WL0 8. The size of a region where the third connection wiring 32 is provided may be reduced as compared to the size of the entire region where the multiplexer is disposed. Thus, it is possible to reduce a size of the semiconductor memory device.

When the word line multiplexer WL0_MUX_2 28 is provided in the sixth region 34 adjacent to the third region 18 and the fifth region 30, outside the first region 4, it is possible to connect the word line multiplexer WL0_MUX_2 28 to the word line wiring WL0 8 by the third connection wiring 32 (32b) provided in the fifth region 30. Thus, it is possible to effectively utilize a semiconductor memory device formation space, and this may contribute to the size reduction.

According to the semiconductor memory device of the embodiment, it is possible to provide a semiconductor memory device that may be reduced in size.

Second Embodiment

Here, descriptions of the same elements as those in the first embodiment are not repeated.

FIGS. 5A to 5C are schematic views of a semiconductor memory device 110 of the embodiment.

A WL1 36 is provided above the bit line wiring BL1 10, and extends parallel to the second side 4b, in the first region 4 above the bit line wiring BL1 10. The memory cells MC are further provided between the bit line wiring BL1 10 and the word line wiring WL1 36.

A word line multiplexer WL1_MUX 42 is provided in a seventh region 40 adjacent to the fifth region 30 in the y direction. The word line wiring WL1 36 is connected to the word line multiplexer WL1_MUX 42 by a fourth connection wiring 44.

The embodiment describes the arrangement of multiplexers in a case where a memory cell array MCA of the semiconductor memory device 110 further includes the word line wiring WL1.

According to the semiconductor memory device of the embodiment as well, it is possible to provide a semiconductor memory device that may be reduced in size.

Third Embodiment

Here, descriptions of the same elements as those in the first embodiment and the second embodiment are not repeated.

FIGS. 6A to 6C are schematic views of a semiconductor memory device 120 of the embodiment.

In the semiconductor memory device 120, an eighth region 60 where another memory cell array MCA is provided is present. The eighth region 60 is a region that is adjacent to the first region 4 in the y direction such that the fifth region 30 is interposed therebetween. Specifically, the eighth region 60 is a rectangular region that has a fourth side 60a, a fifth side 60b, and a sixth side 60c facing the fifth side 60b, in a plane parallel to the surface of the substrate 2. In FIGS. 6A to 6C, the eighth region 60 is illustrated as a rectangular region, but is not limited to the rectangular shape. The fourth side 60a is parallel to the x direction, and the fifth side 60b and the sixth side 60c are parallel to the y direction.

A BL0 62 extends parallel to the fourth side 60a, in the eighth region 60 above the substrate 2. A word line wiring WL0 64 extends parallel to the fifth side 60b, in the eighth region above the bit line wiring BL0 62. A bit line wiring BL1 66 extends parallel to the fourth side 60a, in the eighth region 60 above the word line wiring WL0 64. The memory cells MC are provided between the bit line wiring BL0 62 and the word line wiring WL0 64, and between the word line wiring WL0 64 and the bit line wiring BL1 66, respectively.

A bit line multiplexer BL0_MUX 70 is provided in a ninth region 68 along the fifth side 60b, in the eighth region 60 between the substrate 2 and the BL0 62.

A sixth connection wiring 72 is provided between the bit line multiplexer BL0_MUX 70 and the bit line wiring BL0 62 to connect the bit line multiplexer BL0_MUX 70 to the bit line wiring BL0 62. The number of the sixth connection wirings 72 corresponds to the number of connections between the bit line multiplexer BL0_MUX 70 and the bit line wiring BL0 62, but illustration thereof is omitted in FIG. 6B.

A bit line multiplexer BL1_MUX 76 (is provided in a tenth region 74 adjacent to the ninth region 68 in the x direction, outside the eighth region 60.

A seventh connection wiring 78 is provided between the bit line multiplexer BL1_MUX 76 and the bit line wiring BL1 66 to connect the bit line multiplexer BL1_MUX 76 to the bit line wiring BL1 66. The number of the seventh connection wirings 78 corresponds to the number of connections between the bit line multiplexer BL1_MUX 76 and the bit line wiring BL1 66 although that is not illustrated in FIG. 6B.

A word line multiplexer WL0_MUX_1 82 (an example of the eighth multiplexer) is provided in an eleventh region 80 along the fourth side 60a between the sixth side 60c and the ninth region 68, in the eighth region 60 between the substrate 2 and the bit line wiring BL0 62.

A word line multiplexer WL0_MUX_2 84 (an example of the ninth multiplexer) is provided outside the first region 4 and the eighth region 60.

For example, the word line multiplexer WL0_MUX_2 84 is provided in a twelfth region 86 that is adjacent to the tenth region 74 in the y direction outside the first region and the eighth region 60. That is, the word line multiplexer WL0_MUX_2 84 is provided between, for example, the bit line multiplexer BL1_MUX 18 and the bit line multiplexer BL1_MUX 74.

Then, for example, as illustrated in FIG. 6C, the word line multiplexer WL0_MUX_1 82 is connected to a part of the word line wiring WL0 64 by, for example, an eighth connection wiring 86a provided in a thirteenth region 88 between the fifth region 30 and the eleventh region 80, and the wiring 31 provided in the substrate 2. The word line multiplexer WL0_MUX_2 84 is connected to a part of the word line wiring WL0 64 by, for example, an eighth connection wiring 86b provided in the thirteenth region 88.

The third embodiment is an embodiment where memory cell arrays MCAs are arranged in the y direction. In this case, it is desirable that the word line multiplexers WL0_MUX_2 are provided to be adjacent to each other like word line multiplexer WL0_MUX_2 34 and word line multiplexer WL0_MUX_2 86. This is because the fifth region 30 and the thirteenth region 88 which are adjacent to each other are integrated, so that it is possible to effectively utilize these regions in arrangement of wirings or the like, and this contributes to the size reduction.

Figure 7:
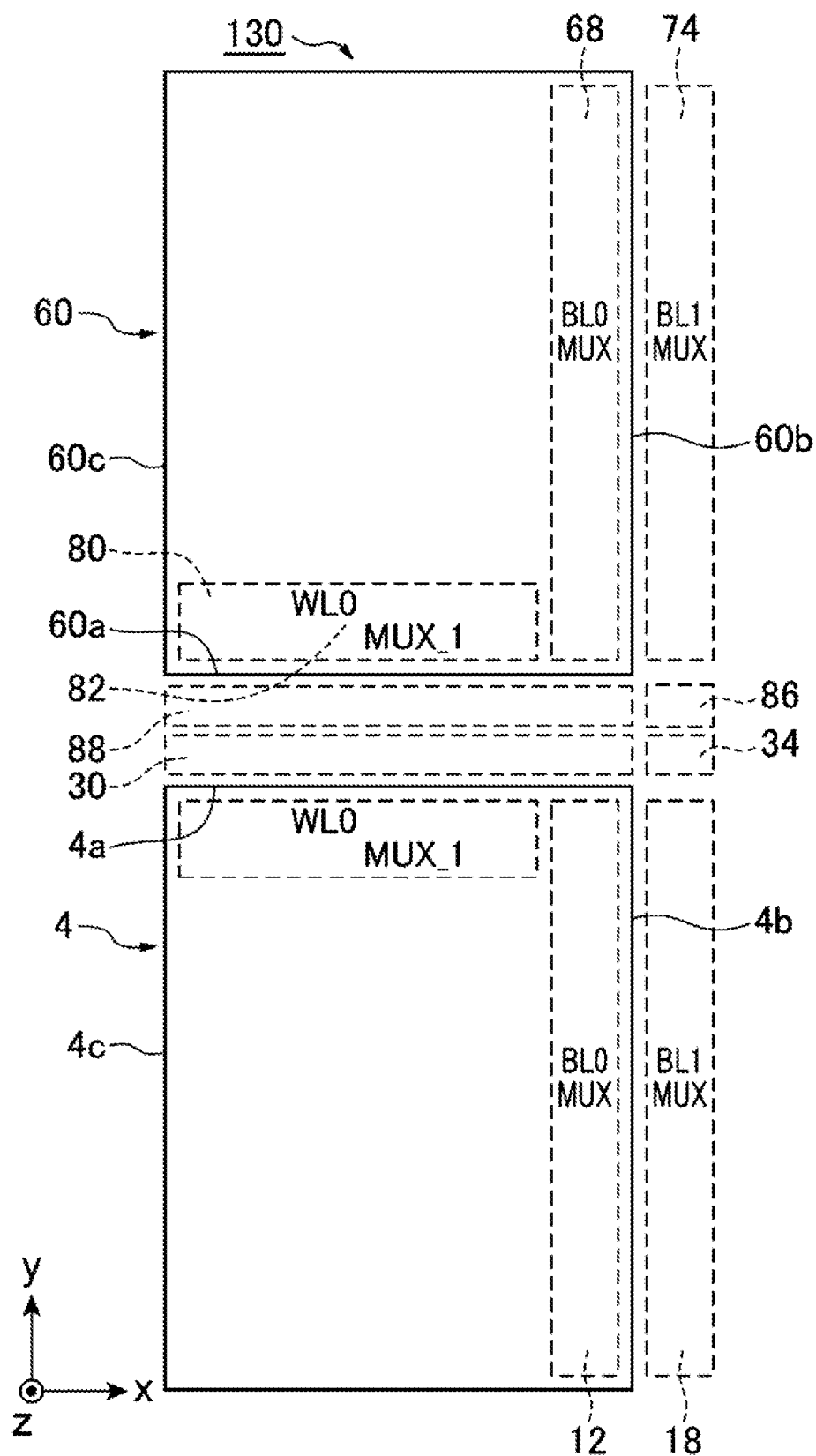
FIG. 7 is a schematic view of a semiconductor memory device according to another aspect of the third embodiment.

FIG. 7 is a schematic view of a semiconductor memory device 130 according to another aspect of the embodiment.

In the semiconductor memory device 120 illustrated in FIG. 6A, the width of the word line multiplexer WL0_MUX_2 34 in the y direction is wider than the width of the fifth region 30 in the y direction. However, as in the semiconductor memory device 130, the width of the word line multiplexer WL0_MUX_2 34 in the y direction may be the same as the width of the fifth region 30 in the y direction. In addition, the width of the word line multiplexer WL0_MUX_2 34 in the y direction may be narrower than the width of the fifth region 30 in the y direction.

In the semiconductor memory device 120 illustrated in FIG. 6A, the width of the word line multiplexer WL0_MUX_2 in the y direction is wider than the width of the thirteenth region 88. However, as in the semiconductor memory device 130, the width of the word line multiplexer WL0_MUX_2 84 in the y direction may be the same as the width of the thirteenth region 88 in the y direction. In addition, the width of the word line multiplexer WL0_MUX_2 84 in the y direction may be narrower than the width of the thirteenth region 88 in the y direction.

Furthermore, as in the semiconductor memory device 130, the fifth region 30 and the thirteenth region 88 may be close to each other or in contact with each other in the y direction.

According to the semiconductor memory device of the embodiment as well, it is possible to provide a semiconductor memory device that may be reduced in size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of first wirings above the substrate in a first plane parallel to a substrate surface, each extending in a first direction;
   a plurality of second wirings above the plurality of first wirings in a second plane parallel to the substrate surface, each extending in a second direction crossing the first direction;
   a plurality of third wirings above the plurality of second wirings in a third plane parallel to the substrate surface, each extending in the first direction;
   a plurality of memory cells provided between the plurality of first wirings and the plurality of second wirings, and between the plurality of second wirings and the plurality of third wirings, respectively;
   a first multiplexer that extends in the second direction and is provided in a first region which overlaps with the plurality of first, second, and third wirings in a third direction that crosses the first and second directions;
   a plurality of first connection wirings, each extending in the third direction to connect the first multiplexer to one of the plurality of first wirings;
   a second multiplexer that extends in the second direction and is provided in a second region which is adjacent to the first region in the first direction, and does not overlap with any of the plurality of first and second wirings in the third direction;
   a plurality of second connection wirings, each extending in the third direction to connect the second multiplexer to one of the plurality of third wirings;
   a third multiplexer that extends in the first direction and is provided in a third region which overlaps with the plurality of first, second, and third wirings in the third direction; and
   a plurality of third connection wirings, each extending in the third direction to connect the third multiplexer to one of the plurality of second wirings.

2. The semiconductor memory device according to claim 1, further comprising:
   a fourth multiplexer provided in a fourth region which is adjacent to the second region in the second direction and does not overlap with any of the plurality of first, second, and third wirings in the third direction; and
   a plurality of fourth connection wirings, each extending in the first and third directions to connect the fourth multiplexer to one of the plurality of second wirings.

3. The semiconductor memory device according to claim 2, wherein the plurality of second wirings extend in the second direction into a fifth region which does not overlap with any of the plurality of first and third wirings in the third direction.

4. The semiconductor memory device according to claim 3, wherein the fourth region is adjacent to the fifth region in the first direction.

5. The semiconductor memory device according to claim 4, further comprising:
   a plurality of fourth wirings above the plurality of third wirings, each extending in the second direction;
   a fifth multiplexer that extends in the first direction and is provided in a sixth region which is adjacent to the fifth region in the second direction; and
   a plurality of fifth connection wirings, each extending in the third direction to connect the fifth multiplexer to one of the plurality of fourth wirings.

6. The semiconductor memory device according to claim 5, wherein the plurality of memory cells is further provided between the plurality of third wirings and the plurality of fourth wirings.

7. A semiconductor memory device comprising:
   a substrate;
   first and second planes of memory cells, that are above and parallel to a substrate surface;
   a plurality of first wirings, each extending in a first direction, in a third plane that is parallel to the substrate surface and between the substrate surface and the first plane of memory cells;
   a plurality of second wirings, each extending in a second direction that crosses the first direction, in a fourth plane that is parallel to the substrate surface and between the first plane of memory cells and the second plane of memory cells;
   a plurality of third wirings, each extending in the first direction, in a fifth plane that is parallel to the substrate surface and above the second plane of memory cells;
   a first multiplexer that extends in the second direction and is provided in a first rectangular box region, side ends of which are defined by the memory cells of the first and second planes in the first and second directions;
   a plurality of first connection wirings, each extending in a third direction, which crosses the first and second directions, to connect the first multiplexer to one of the plurality of first wirings;
   a second multiplexer that extends in the second direction and is provided in a second rectangular box region which is adjacent to the first rectangular box region in the first direction;

a plurality of second connection wirings, each extending in the third direction to connect the second multiplexer to one of the plurality of third wirings;
a third multiplexer that extends in the first direction and is provided in the first rectangular box region; and
a plurality of third connection wirings, each extending in the third direction to connect the third multiplexer to one of the plurality of second wirings.

8. The semiconductor memory device according to claim 7, further comprising:
a fourth multiplexer provided in a third rectangular box region which is adjacent to the second rectangular box region in the second direction; and
a plurality of fourth connection wirings, each extending in the first and third directions to connect the fourth multiplexer to one of the plurality of second wirings.

9. The semiconductor memory device according to claim 8, wherein some of the second wirings extend in the second direction into a fourth rectangular box region which is adjacent to the first rectangular box region in the second direction.

10. The semiconductor memory device according to claim 9, wherein the third rectangular box region is adjacent to the fourth rectangular box region in the first direction.

11. A semiconductor memory device, comprising:
a substrate;
a plurality of first wirings above the substrate, each extending in a first direction;
a plurality of second wirings above the plurality of first wirings, each extending in a second direction that crosses the first direction;
a plurality of third wirings above the plurality of second wirings, each extending in the first direction;
a first plane of memory cells between the plurality of first wirings and the plurality of second wirings;
a second plane of memory cells between the plurality of second wirings and the plurality of third wirings;
a plurality of fourth wirings above the substrate, each extending in the first direction;
a plurality of fifth wirings above the plurality of fourth wirings, each extending in the second direction;
a plurality of sixth wirings above the plurality of fifth wirings, each extending in the first direction;
a third plane of memory cells between the plurality of fourth wirings and the plurality of fifth wirings;
a fourth plane of memory cells between the plurality of fifth wirings and the plurality of sixth wirings;
a first multiplexer that extends in the second direction, is connected to the plurality of first wirings, and is provided in a first rectangular box region, side ends of which are defined by the memory cells of the first and second planes in the first and second directions;
a second multiplexer that extends in the first direction, is connected to the plurality of second wirings, and is provided in the first rectangular box region;
a third multiplexer that extends in the second direction, is connected to the plurality of fourth wirings, and is provided in a second rectangular box region, side ends of which are defined by the memory cells of the third and fourth planes in the first and second directions; and
a fourth multiplexer that extends in the first direction, is connected to the plurality of fifth wirings, and is provided in the second rectangular box region.

12. The semiconductor memory device according to claim 11, wherein
the second multiplexer is located at an end of the first rectangular box region in the second direction that is closer to the second rectangular box region; and
the fourth multiplexer is located at an end of the second rectangular box region in the second direction that is closer to the first rectangular box region.

13. The semiconductor memory device according to claim 12, further comprising:
a fifth multiplexer connected to the plurality of third wirings in a third rectangular box region adjacent to the first rectangular box region in the first direction; and
a sixth multiplexer connected to the plurality of sixth wirings in a fourth rectangular box region adjacent to the second rectangular box region in the first direction.

14. The semiconductor memory device according to claim 13, further comprising:
a seventh multiplexer connected to the plurality of second wirings in a fifth rectangular box region adjacent to the third rectangular box region in the second direction; and
an eighth multiplexer connected to the plurality of fifth wirings in a sixth rectangular box region adjacent to the fourth rectangular box region in the second direction and adjacent to the fifth rectangular box region in the second direction.

* * * * *